United States Patent
Chou et al.

(10) Patent No.: US 7,550,836 B2
(45) Date of Patent: Jun. 23, 2009

(54) STRUCTURE OF PACKAGE ON PACKAGE AND METHOD FOR FABRICATING THE SAME

(75) Inventors: Che-Ya Chou, Kaohsiung (TW); Chi-Tsung Chiu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/889,797

(22) Filed: Aug. 16, 2007

(65) Prior Publication Data

US 2008/0099904 A1    May 1, 2008

(30) Foreign Application Priority Data

Oct. 27, 2006    (TW) ............................... 95139858 A

(51) Int. Cl.
*H01L 23/02* (2006.01)
(52) U.S. Cl. .................. 257/686; 257/697; 257/780; 438/118
(58) Field of Classification Search ............. 257/686, 257/697, 780; 438/118
See application file for complete search history.

(56) References Cited

U.S. PATENT DOCUMENTS

| 6,188,127 | B1 * | 2/2001 | Senba et al. ............... 257/686 |
| 2007/0145563 | A1 * | 6/2007 | Punzalan et al. ........... 257/686 |
| 2007/0197099 | A1 * | 8/2007 | DiStefano ............... 439/620.1 |

* cited by examiner

*Primary Examiner*—N Drew Richards
*Assistant Examiner*—Mamadou Diallo
(74) *Attorney, Agent, or Firm*—Bacon & Thomas, PLLC

(57) ABSTRACT

A structure of a package on package and a method for fabricating the same are provided. The structure of the package on package includes a first package, a second package and a plurality of pins. The first package includes a first substrate and a first chip disposed thereon. The second package includes a second substrate and a second chip disposed thereon. The second package is disposed under the first package. The second package includes a plurality of holes. The pins are disposed on the first package and inserted to the holes so as to electrically connect the first package and the second package.

18 Claims, 3 Drawing Sheets

STRUCTURE OF PACKAGE ON PACKAGE AND METHOD FOR FABRICATING THE SAME

This application claims the benefit of Taiwan application Serial No. 095139858, filed Oct. 27, 2006, the subject matter of which is incorporated herein by reference.

BACKGROUND OF THE INVENTION

1. Field of the Invention

The invention relates in general to a structure of a package on package and a method for fabricating the same, and more particularly to a structure of a package on package connected by pins and a method for fabricating the same.

2. Description of the Related Art

As portable multimedia devices become more and more popular, the trend toward new storage structures with higher digital signal processing, larger storage capacity and more flexibility grows accordingly. Therefore, the application of stacked package on package (PoP) extends rapidly.

The package on package is a new three-dimensional packaging technology with lowest cost for logic and memory Integration. The stacked package on package is used for developing devices with new appearance or higher integration. Also, the package on package has small volume due to stacked structure. Therefore, the size of the mother board is not increased or even reduced.

FIG. 1 is a cross-sectional view of a conventional package on package. Please referring to FIG. 1, the structure of the conventional package on package 10 includes an upper package 12 and a lower package 14 connected together by solder balls 20. A chip 18, circuits and the solder balls 20 are disposed on a surface of a substrate 16 of the lower package 14.

The available space for disposing the circuits is limited because the solder balls 20 and the circuits are both disposed on the lower substrate 16. Therefore, it is difficult to dispose vias when the circuits have to be disposed on inner layers. It is even more difficult to disposes the circuits in the high-density area adjacent to the chip 18. Therefore, multilayer technology is used or the size of the package is increased for solving the above problems.

SUMMARY OF THE INVENTION

The invention is directed to a structure of a package on package and a method for fabricating the same. Packages are connected by pins so as to increase the space for wiring layout.

According to the present invention, a structure of a package on package and a method for fabricating the same are provided. The package on package includes a first package, a second package and a plurality of pins. The first package includes a first substrate and a first chip disposed thereon. The second package includes a second substrate and a second chip disposed thereon. The second package is disposed under the first package and includes a plurality of holes. The pins are disposed on the first package and inserted in the holes so as to electrically connect the first package and the second package.

According to the present invention, another structure of a package on package including a first package, a second package, a plurality of first pins, a plurality of second pins and a connecting component is provided. The first package includes a first substrate and a first chip disposed thereon. The second package includes a second substrate and a second chip disposed thereon. The second package is dispose under the first package. The first pins are disposed on the first package, and the second pins are disposed on the second package. The connecting component is disposed between the first pins and the second pins so as the electrically connect the first package and the second package.

According to the present invention, a method of fabricating a package on package is provided. First, a first package is provided. A first chip is disposed on and electrically connected with a first substrate. Next, a second package is provided. A second chip is disposed on and electrically connected with a second substrate. Then, a plurality of first pins are disposed on the first substrate. Afterward, a plurality of second pins are disposed on the second substrate. Later, a connecting component is disposed between the second pins. Subsequently, the first pins of the first package are inserted in the connecting component correspondingly, so as to electrically connect the first package and the second package.

According to the present invention, another method of fabricating a package on package is provided. First, a first package is provided. A first chip is disposed on and electrically connected with a first substrate. Next, a second package is provided. A second chip is disposed on and electrically connected with a second package. Then, a plurality of pins are disposed on the first substrate. Afterward, a plurality of holes are formed in the second substrate. Later, a plurality of pins are inserted in the holes so as to electrically connect the first package and the second package.

The invention will become apparent from the following detailed description of the preferred but non-limiting embodiments. The following description is made with reference to the accompanying drawings.

DETAILED DESCRIPTION OF THE INVENTION

First Embodiment

Figure 1:
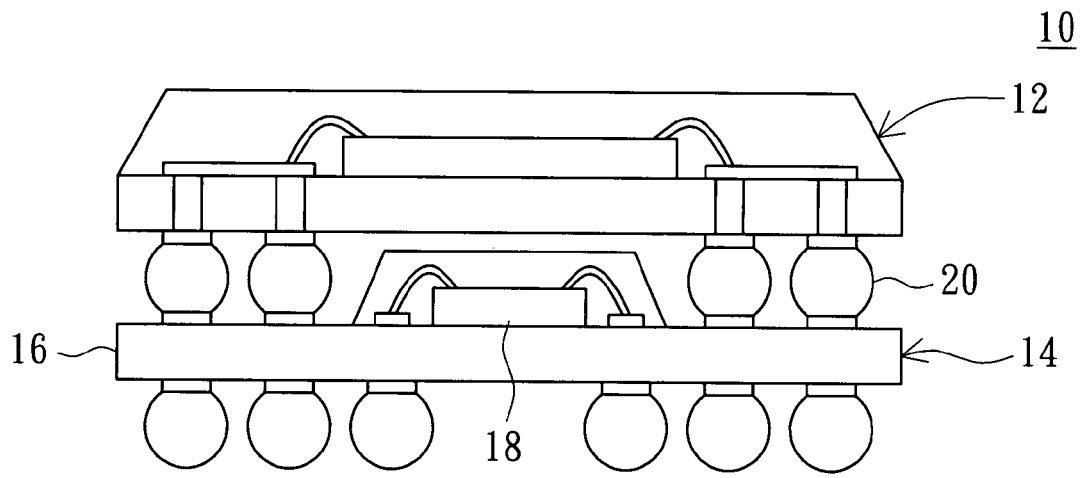
FIG. 1 (Prior Art) is a cross-sectional view of a conventional package on package.
Figure 2:
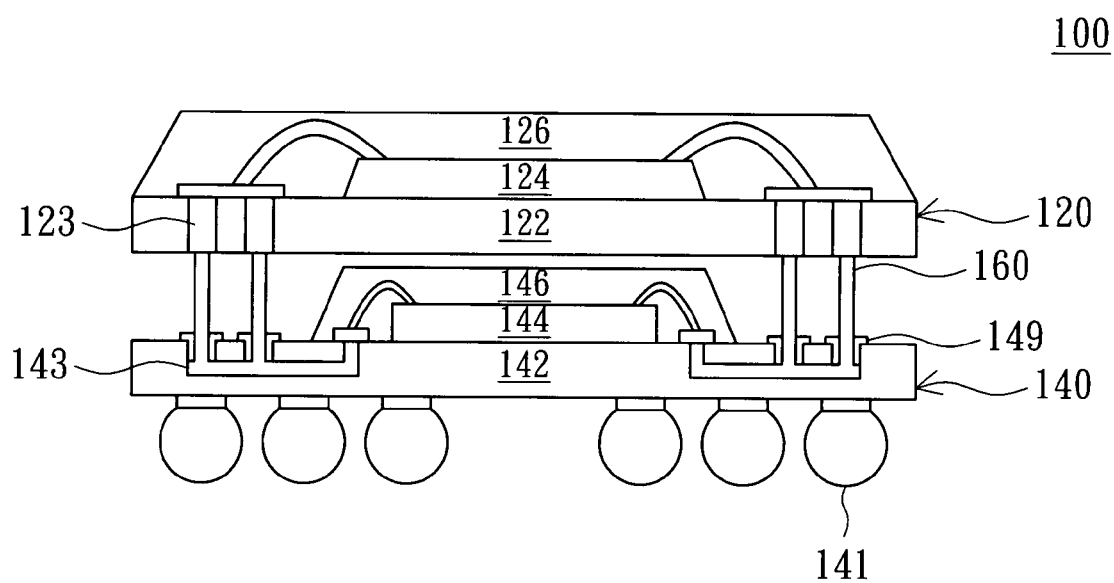
FIG. 2 illustrates a structure of a package on package according to a first embodiment of the present invention.

Please referring to FIG. 2, illustrating a structure of a package on package according to a first embodiment of the present invention. The package on package 100 of the present embodiment includes a first package 120, a second package 140 and a plurality of pins 160. The first package 120 includes a first substrate 122 and a first chip 124 disposed on the first substrate 122. The first package 120 further includes a first inner circuit 123 and a first molding material 126. The first inner circuit 123 is formed in the first substrate 122. The first chip 124 and the first inner circuit 123 are electrically connected together. The first molding material 126 encapsulates at least a portion of the first substrate 122 and the first chip 124.

The second package 140 includes a second substrate 142 and a second chip 144 disposed on the second substrate 142. The second package 140 is disposed under the first package 120. The second package 140 further includes a second inner circuit 143, a second molding material 146 and several solder balls 141. The second inner circuit 143 is formed in the second substrate 142. The second chip 144 is electrically connected with the second inner circuit 143. The second molding material 146 encapsulates at least a portion of the second substrate 142 and the second chip 144. Several solder balls 141 are disposed on a lower surface of the second substrate 142.

Figure 3A:
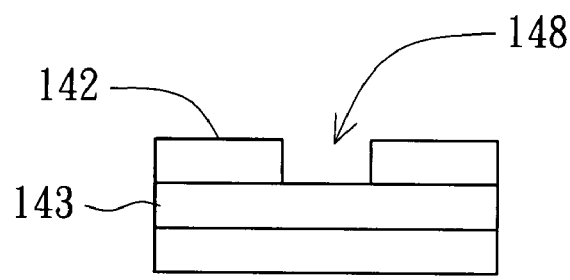
FIGS. 3A~3C illustrate steps of connecting pins with holes according to the first embodiment of the present invention.

FIG. 3A is an enlarged view of part of the second substrate in FIG. 2. What is worth mentioning is that a plurality of holes 148 are formed on the second substrate 142. Preferably, the second package 140 further includes a plurality of conductive receptacles 149 disposed inside the holes 148 of the second substrate 142.

A plurality of pins 160 are disposed on the first package 120 and inserted in the holes 148 for electrically connecting the first package 120 and the second package 140. The pins 160 are disposed on a lower surface of the first substrate 120 and electrically connected with the first inner circuit 123.

The pins replace the conventional solder balls to connect the two packages. The saved space can be used for wiring layout, disposing the chip, molding, etc. As a result, the space on the second substrate can be used more effectively and flexibly. For example, even when a complicated module, such as a multi-chip package, is used in the package on package, there is no need to increase the substrate area. The wiring layout space on the second substrate is increased and capable of containing more complicated circuits. Furthermore, a large-size chip can be disposed on the substrate of the package on package of the present invention. Moreover, the size of the second substrate can be decreased so that the size of the package on package is reduced.

The method for fabricating the package on package 100 includes following steps. First, the first package 120 is provided. The details are as follow. A first inner circuit 123 is formed in the first substrate 122 first. Next, the first chip 124 is disposed on the first substrate 124, and electrically connected with the first substrate 122. For example, the first chip 124 is wire-bonded with the first substrate 122, as shown in FIG. 2. Then, the first molding material 126 over molds at least a portion of the first substrate 122 and the first chip 124.

Next, the second package 140 is provided. Details of this step are as follow. First, the second inner circuit 143 is formed in the second substrate 140. Next, the second chip 144 is disposed on the second substrate 142, and electrically connected with the second substrate 142. For example, the second chip 144 is wire-bonded with the second substrate 142, as shown in FIG. 2. Then, the second molding material 146 over molds at least a portion of the second substrate 142 and the second chip 144.

Then, the pins 160 are disposed on the first substrate 122. The pins 160 are electrically connected with the first inner circuit 123 and disposed on the lower surface of the first substrate 122.

Figure 3B:
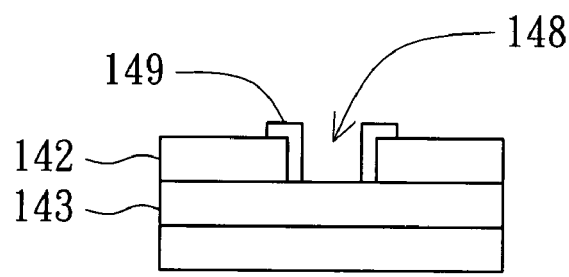
Figure 3C:
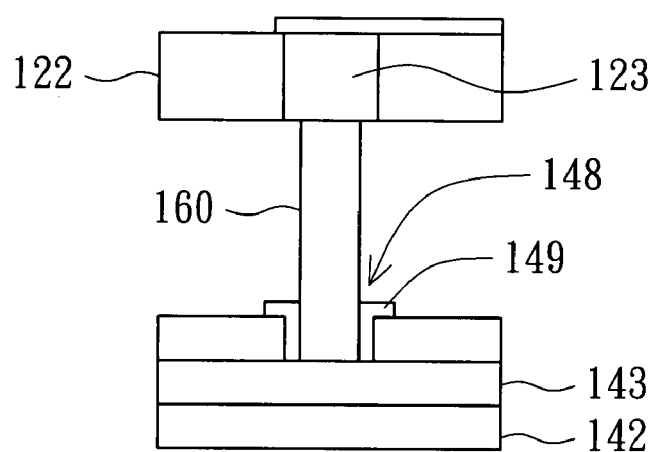

FIGS. 3A~3C illustrate steps of connecting the pins and the holes. Please referring to FIG. 3A, a plurality of holes 148 are formed in the second substrate 142. The holes 148 are formed on the upper surface of the second substrate 142 and expose the second inner circuit 143. Please referring to FIG. 3B, a plurality of conductive receptacles 129 are formed in the holes 148 for protecting the holes 148 from collapse and guiding the pins 160 entering the holes 148.

Afterwards, the pins 160 are inserted in the holes 148 and the conductive receptacles 149, as shown in FIG. 3C. When the pins 160 are inserted in the conductive receptacles 149, the pins 160 are electrically connected with the second inner circuit 143 for electrically connecting the first package 120 and the second package 140.

Second Embodiment

Figure 4:
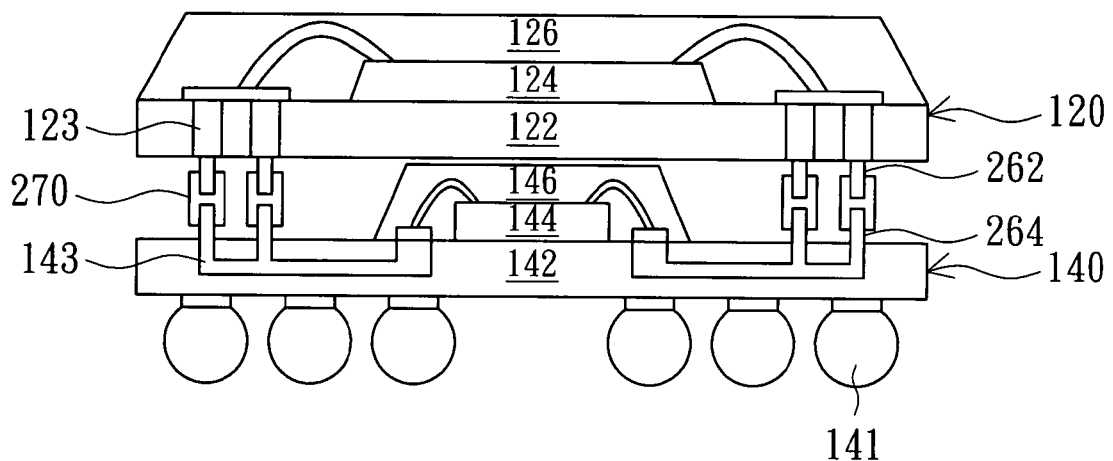
FIG. 4 illustrates a structure of a package on package according to a second embodiment of the present invention.

The present embodiment and the above embodiment are only different in the connection of the first package and the second package. The same parts are not described redundantly. Please referring to FIG. 4, the structure of the package on package according to a second embodiment of the present invention is illustrated in FIG. 4. The package on package 200 of the present embodiment includes the first package 120, the second package 140, a plurality of first pins 262, a plurality of second pins 264 and a connecting component 270. The first pins 262 are disposed on the first package 120. Preferably, the first pins 262 are disposed on the lower surface of the first substrate 122 and electrically connected with the first inner circuit 123. The second pins 264 are disposed on the second package 140. Preferably, the second pins 264 are disposed on the upper surface of the second substrate 140 and electrically connected with the second inner circuit 143.

Figure 5:
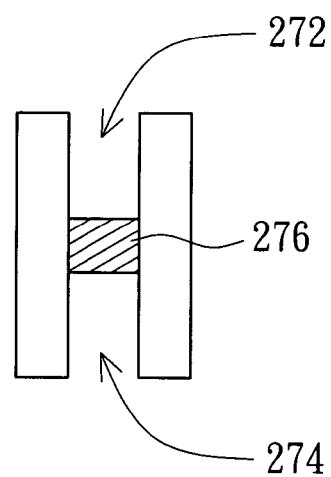
FIG. 5 is a cross-sectional view of a connecting component in FIG. 4.

The connecting component 270 is disposed between the first pins 262 and the second pins 264 for electrically connecting the first package 120 and the second package 140. Please referring to FIG. 5, a cross-sectional view of the connecting component in FIG. 4 is illustrated in FIG. 5. The connecting component 270 includes a first clamp 272, a second clamp 274 and a conductive part 276. The first clamp 272 is for clamping the first pins 262, and the second clamp 274 is for clamping the second pins 264. The conductive part 276 is disposed between the first clamp 272 and the second clamp 274 for electrically connecting the second pins 264 clamped by the second clamp 274 and the first pins 262 clamped by the first clamp 272. What is worth mentioning is that the connecting component 270 can be used for connecting only one first pin 262 and one second pin 264 (as shown in FIG. 5). Therefore, several connecting components are needed in the package on package 200. However, the connecting component is not limited thereto. Only one connecting component can be used for connecting a plurality of first pins 262 and a plurality of second pins 264.

There can be many different kinds of methods for fabricating the package on package. One method is illustrated as follow for example. The method for fabricating the package on package according to the present embodiment includes following steps. After the first package 120 and the second package 140 are provided, a plurality of first pins 262 are disposed on the first substrate 122, and a plurality of second pins 264 are disposed on the second substrate 142. The first pins 262 are disposed on the lower surface of the first substrate 122 and electrically connected with the first inner circuit 123. The second pins 264 are formed on the upper surface of the second substrate 142 and electrically connected with the second inner circuit 143. Then, the connecting component 270 is disposed on the first pins 262 to hold the first pins 262. Afterwards, the second pins 264 of the second package 140 are inserted in the connecting component 270 correspondingly. As a result, the first package 120 is electrically connected with the second package 140.

In the structure of the package on package and the method for fabricating the same of the above embodiments, several packages are connected by the pins. The saved space can be used for wiring layout, disposing chips, molding, etc. As a result, the space on the second substrate can be used more effectively and flexibly. For example, even a multi-chip package or another more complicated module is used in the structure of the package on package, there is no need to increase the substrate area. The wiring layout space on the second substrate is enlarged and capable of containing more complicated circuits.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A structure of package on package comprising:
    a first package comprising a first substrate and a first chip, the first substrate having a first surface and a second surface opposite thereto, the first chip disposed on the first surface of the first substrate;
    a second package comprising a second substrate and a second chip, the second substrate having a first surface and a second surface opposite thereto, the second chip disposed on the first surface of the second substrate, the second package disposed under the first package, the first surface of the second substrate having a plurality of holes; and
    a plurality of pins disposed on the second surface of the first substrate and inserted in the holes for electrically connecting the first package and the second package.

2. The structure of package on package according to claim 1, wherein the second package further comprises a plurality of conductive receptacles disposed in the holes of the second substrate;
    wherein the pins are inserted in the conductive receptacles.

3. The structure of package on package according to claim 1, wherein the second package further comprises:
    a second inner circuit formed in the second substrate, wherein the second chip is electrically connected with the second inner circuit;
    a second molding material encapsulating at least a portion of the second substrate and the second chip; and
    a plurality of solder balls disposed on the second surface of the second substrate;
    wherein the holes are formed on the first surface of the second substrate and expose the second inner circuit.

4. The structure of package on package according to claim 1, wherein the first package further comprises:
    a first inner circuit formed in the first substrate and electrically connected to the first chip; and
    a first molding material encapsulating at least a portion of the first substrate and the first chip;
    wherein the pins are disposed on the second surface of the first substrate and electrically connected with the first inner circuit.

5. A structure of package on package comprising:
    a first package comprising a first substrate and a first chip, the first substrate having a first surface and a second surface opposite thereto, the first chip disposed on the first surface of the first substrate;
    a second package comprising a second substrate and a second chip, the second substrate having a first surface and a second surface opposite thereto, the second chip disposed on the first surface of the second substrate, the second package disposed under the first package;
    a plurality of first pins disposed on the second surface of the first substrate;
    a plurality of second pins disposed on the first surface of the second substrate; and
    a connecting component interposed between the first pins and the second pins for electrically connecting the first package and the second package.

6. The structure of package on package according to claim 5, wherein the connecting component comprises:
    a first clamp for clamping the first pins;
    a second clamp for clamping the second pins; and
    a conductive part disposed between the first clamp and the second clamp for electrically connecting the second pins clamped by the second clamp and the first pins clamped by the first clamp.

7. The structure of package on package according to claim 5, wherein the first package further comprises:
    a first inner circuit formed in the first substrate and electrically connected to the first chip; and
    a first molding material encapsulating at least a portion of the first substrate and the first chip;
    wherein the first pins are disposed on the second surface of the first substrate and electrically connected with the first inner circuit.

8. The structure of package on package according to claim 5, wherein the second package further comprises:
    a second inner circuit formed in the second substrate and electrically connected to the second chip;
    a second molding material encapsulating at least a portion of the second substrate and the second chip; and
    a plurality of solder balls disposed on the second surface of the first substrate;
    wherein the second pins are disposed on the first surface of the second substrate and electrically connected with the second inner circuit.

9. A method for fabricating a package on package, the method comprising:
    providing a first package, the first package comprising a first substrate and a first chip, the first substrate having a first surface and a second surface opposite thereto, the first chip disposed on the first surface of the first substrate and electrically connected to the first substrate;
    providing a second package, the second package comprising a second substrate and a second chip, the second substrate having a first surface and a second surface opposite thereto, the second chip disposed on the first surface of the second substrate and electrically connected to the second substrate;
    disposing a plurality of first pins on the second surface of the first substrate;
    disposing a plurality of second pins on the first surface of the second substrate;
    disposing a connecting component to hold the second pins; and
    correspondingly inserting the first pins in the connecting component so as to electrically connect the first package with the second package.

10. The method according to claim 9, wherein the step of providing the first package further comprises:
    forming a first inner circuit in the first substrate;
    wherein the first pins are electrically connected with the first inner circuit and disposed on the second surface of the first substrate.

11. The method according to claim 9, wherein the step of providing the first package further comprises:
    over molding at least a portion of the first substrate and the first chip by a first molding material.

12. The method according to claim 9, wherein the step of providing the second package further comprises:
    forming a second inner circuit in the second substrate;
    wherein the second pins are formed on the first surface of the second substrate, and electrically connected with the second inner circuit.

13. The method according to claim 9, wherein the step of providing the second package further comprises:
over molding at least a portion of the second substrate and the second chip by a second molding material.

14. A method for fabricating a package on package, the method comprising:
providing a first package, the first package comprising a first substrate and a first chip, the first substrate having a first surface and a second surface opposite thereto, the first chip disposed on the first surface of the first substrate and electrically connected to the first substrate;
providing a second package, the second package comprising a second substrate and a second chip, the second substrate having a first surface and a second surface opposite thereto, the second chip disposed on the first surface of the second substrate and electrically connected to the second substrate;
disposing a plurality of pins on the second surface of the first substrate;
forming a plurality of holes in the first surface of the second substrate; and
inserting the pins in the holes for electrically connecting the first package and the second package.

15. The method according to claim 14 further comprising:
forming a second inner circuit in the second substrate, wherein the holes expose the second inner circuit;
forming a plurality of conductive receptacles in the holes; and
inserting the pins in the conductive receptacles;
wherein the pins are electrically connected with the second inner circuit when the pins are inserted in the conductive receptacles.

16. The method according to claim 14, wherein the step of providing the second package further comprises:
over molding at least a portion of the second substrate and the second chips by a second molding material.

17. The method according to claim 14, wherein the step of providing the first package further comprises:
forming a first inner circuit in the first substrate;
wherein the pins are electrically connected with the first inner circuit and disposed on the second surface of the first substrate.

18. The method according to claim 14, wherein the step of providing the first package further comprises:
over molding at least a portion of the first substrate and the first chip by a first molding material.

* * * * *